(12) United States Patent
Yap et al.

(10) Patent No.: US 6,632,745 B1
(45) Date of Patent: Oct. 14, 2003

(54) METHOD OF FORMING ALMOST L-SHAPED SPACER FOR IMPROVED ILD GAP FILL

(75) Inventors: Chiew Wah Yap, S'pore (SG); Zheng Zou, Singapore (SG); Eng Hua Lim, Singapore (SG); Nguyen Lac, Singapore (SG); Yelehanka Pradeep, Singapore (SG); Manni Lal, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/222,387

(22) Filed: Aug. 16, 2002

(51) Int. Cl.[7] ............................................. H01L 21/311
(52) U.S. Cl. ........................ 438/696; 438/703; 438/738
(58) Field of Search ................................ 438/696, 703, 438/735, 737, 738, 743, 744, 756, 757, 787, 791

(56) References Cited

U.S. PATENT DOCUMENTS

| | | | |
|---|---|---|---|
| 6,025,267 A | 2/2000 | Pey et al. .................. 438/656 |
| 6,090,691 A | 7/2000 | Ang et al. .................. 438/564 |
| 6,235,597 B1 | 5/2001 | Miles .......................... 438/301 |
| 6,277,683 B1 | 8/2001 | Pradeep et al. ............. 438/200 |
| 6,294,480 B1 * | 9/2001 | Pradeep et al. ............. 438/763 |
| 6,391,732 B1 * | 5/2002 | Gupta et al. ................ 438/305 |
| 6,465,312 B1 * | 10/2002 | Yu ............................... 438/300 |

FOREIGN PATENT DOCUMENTS

FR 2760130 A1 * 8/1998 ......... H01L/21/336

* cited by examiner

*Primary Examiner*—Stephen D. Meier
*Assistant Examiner*—Jamie L. Brophy
(74) *Attorney, Agent, or Firm*—George O. Saile; Rosemary L. S. Pike

(57) ABSTRACT

A patterned and etched layer of gate electrode material is formed over the active surface of a substrate, a layer of liner oxide is created, gate spacers are created.

Under the first embodiment of the invention, a layer of TEOS is deposited over the created structure over which a layer of nitride is deposited, The layer of nitride is etched, this etch is extended into an overetch creating openings through the layer of TEOS where this layer overlies the gate spacers. The gate spacers are then further etched.

Under the second embodiment of the invention, a layer of TEOS is deposited over the created structure. The layer of TEOS is etched, stopping on the silicon nitride of the gate spacers. The gate spacers are then further etched.

45 Claims, 3 Drawing Sheets

METHOD OF FORMING ALMOST L-SHAPED SPACER FOR IMPROVED ILD GAP FILL

BACKGROUND OF THE INVENTION (1) Field of the Invention

The invention relates to the fabrication of integrated circuit devices, and more particularly, to a method of improving Intra Level Dielectric (ILD) gap fill in creating a gate electrode structure.

(2) Description of the Prior Art

Basic to the creation of CMOS devices is the creation of Field Effect Transistors (FET) over active surface regions of a silicon substrate that are electrically isolated by regions of isolation such as Shallow Trench Isolation regions. The creation of FET devices starts with growing a layer of gate oxide over the surface of the substrate. A layer of gate material, typically comprising polysilicon, is deposited over the layer of gate oxide. The layers of gate material and gate oxide are patterned and etched, creating the structure of the gate electrode. Lightly doped impurity implantations are then performed into the surface of the substrate, self-aligned with the structure of the gate electrode, for the creation of Lightly Doped Diffusion (LDD) regions in the surface of the substrate. Gate spacers are then formed over sidewalls of the structure of the gate electrode after which relatively high-energy and high density source and drain impurity implantations are performed that are also self-aligned with the structure and further with the gate spacers of the gate electrode. Improved contact resistance can then be achieved by saliciding the surfaces of the source/drain regions and the top surface of the gate material of the gate electrode. After the process of salicidation has been completed, conductive contact plugs are established to the contact surfaces of the gate electrode by first blanket depositing a layer of dielectric over the created structure. Holes are created through the layer of dielectric, a conductive layer typically comprising metal is deposited over the surface of the layer of dielectric, filling the holes that have been created through the layer of dielectric and electrically contacting the contact points of the gate electrode structure. After excess conductive material has been removed from the surface of the layer of dielectric, points of electrical contact have been established by means of the conductive plugs that have been created through the layer of dielectric in alignment with the contact points of the gate electrode.

Improved semiconductor device performance continues to be achieved by reducing device dimensions, thereby reducing the paths that need to be traveled by electron charges in addition to reducing such factors are resistive loss over interconnect traces and parasitic influences that have a negative impact on device operational speed and performance. This continued reduction of the device elements imposes increased demands of accuracy and control in creating for instance CMOS devices. The invention specifically addresses the creation of gate spacers over sidewalls of the body of the gate electrode. As design rules continue to be reduced, the poly-to-poly spacing of the structure of the created gate electrodes continues to be reduced. Using conventional gate spacer design, the gap fill that is provided by the overlying layer of ILD may become a problem, specifically for CMOS designs in the deep-micron range of device features. A conventional approach of addressing this concern is to create L-shaped gate spacers, thereby allowing more of the ILD to penetrate between adjacent gate electrodes. This approach however has the negative effect of requiring a longer production time in addition with an increased thermal budget and an increased etching step. The invention addresses these concerns by providing a method that allows for the creation of a gate spacer having an L-shaped profile, which can be created while avoiding the previously stated negative aspects of creating such a gate spacer.

U.S. Pat. No. 6,277,683 B1 (Pardeep et al.) shows an L shaped spacer process and salicide process.

U.S. Pat. No. 6,235,597 B1 (Miles) discloses an L shaped spacer process and salicide process.

U.S. Pat. No. 6,090,691 (Ang et al.) shows an L shaped oxide spacer and salicide process.

U.S. Pat. No. 61025,267 (Pey et al.) shows a nitride blocker for a salicide process.

SUMMARY OF THE INVENTION

A principle objective of the invention is to provide gate spacers over the sidewalls of gate electrodes for gate electrode structures of deep sub-micron device dimensions.

Another objective of the invention is to provide a method of creating gate spacers over the sidewalls of gate electrodes such that gate separation and gate isolation is maintained even for extremely closely spaced gate electrodes.

Yet another objective of the invention is to provide a method of creating gate spacers that allows for an adequate amount of Intra Level Dielectric to penetrate between closely spaced gate electrode structures.

In accordance with the objectives of the invention a new method is provided for the creation of gate spacers over the sidewalls of a gate electrode structure. A patterned and etched layer of gate electrode material is formed over the active surface of a substrate, a layer of liner oxide is created, gate spacers are created.

Under he first embodiment of the invention, a layer of TEOS is deposited over the created structure over which a layer of nitride is deposited. The layer of nitride is etched, this etch is extended into an overetch creating openings through the layer of TEOS where this layer overlies the gate spacers. The gate spacers are then further etched.

Under the second embodiment of the invention, a layer of TEOS is deposited over the created structure. The layer of TEOS is etched, stopping on the silicon nitride of the gate spacers. The gate spacers are then further etched.

BRIEF DESCRIPTION OF THE DRAWINGS

FIG. 2 show a cross section after a layer of TEOS has been deposited over the surface of the structure of FIG. 1, a layer of silicon nitride has been deposited over the surface of the layer of TEOS.

FIG. 3 shows a cross section after the layer of nitride has been etched.

FIG. 4 shows a cross section after the etch of the layer of silicon nitride has been extended, creating openings through the layer of TEOS where this layer overlies the gate spacers.

FIG. 5 shows a cross section after the exposed surface of the gate spacers has been etched, creating gate spacers of about an L-shaped profile.

FIG. 6 show a cross section after a layer of TEOS has been deposited over the surface of the structure of FIG. 1.

FIG. 7 shows a cross section after the layer of TEOS ahs been etched, stopping on the nitride of the gate spacers.

FIG. 8 shows a cross section after the exposed surface of the gate spacers has been etched, creating gate spacers of about an L-shaped profile.

DESCRIPTION OF THE PREFERRED EMBODIMENTS

Figure 7:
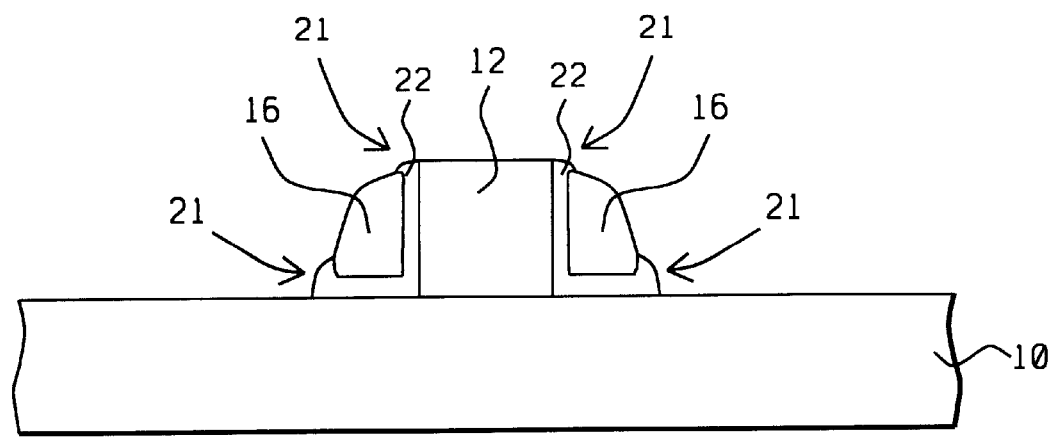
Figure 8:
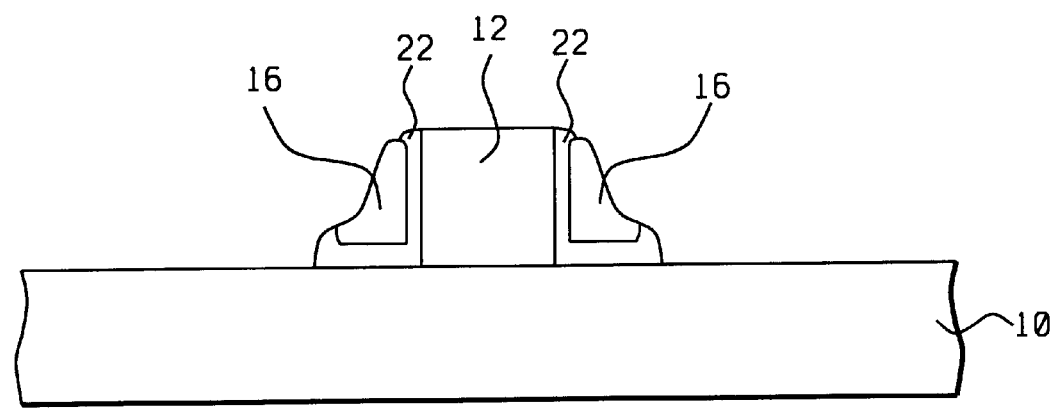

The invention will now be described using FIGS. 1 through 8, with FIGS. 1 through 5 comprising a first embodiment of the invention and FIGS. 6 through 8 comprising a second embodiment of the invention.

The first embodiment of the invention presents a process that is referred to as a nitride salicide block process, the second embodiment of the invention presents a process that is referred to as a tetra-ethyl-ortho-silicate (TEOS) salicide block process.

First discussed will be the nitride salicide block process, which is shown in the cross sections of FIGS. 1 through 5.

Figure 1:
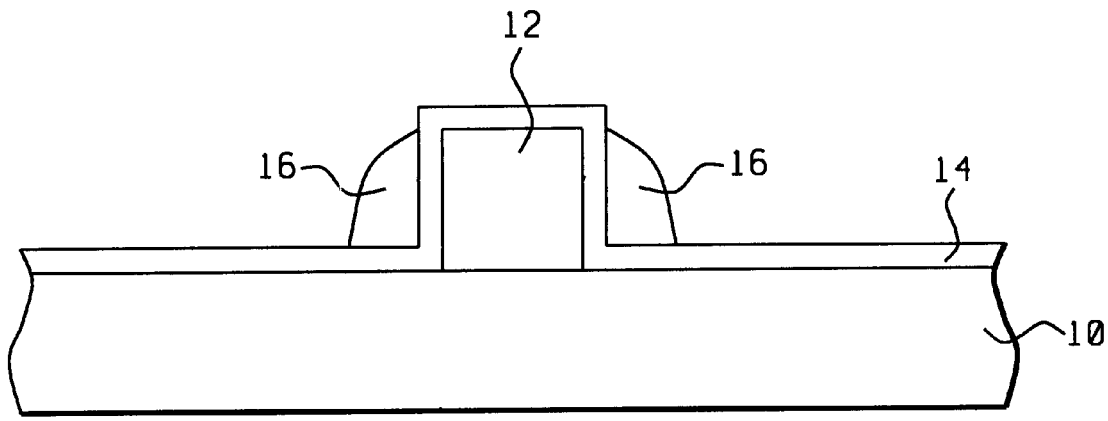
FIG. 1 shows a cross section of the surface of a substrate, a gate electrode has been created over an active surface region of the substrate, impurity implantations (not shown) have been performed into the surface of the substrate, a layer of liner oxide has been formed, gate spacers have been formed over sidewalls of the gate electrode.

The first cross section, that is the cross section of FIG. 1, shows the structure cc a gate electrode created over the surface of a silicon substrate, a layer of oxide liner has been created over the surface of the gate electrode structure while gate spacers have been created over the sidewalls of the gate electrode structure. Specifically highlighted in the cross section of FIG. 1 are:

- 10, the cross section of the surface of a silicon substrate
- 12, the body or structure of a gate electrode, conventionally comprising polysilicon, deposited to a thickness of between about 3,000 and 7,000 Angstrom
- 14, a layer of liner oxide, typically comprising TEOS, created over the surface of the substrate 10 and exposed surfaces of the gate structure 12 to a thickness between about 150 and 250 Angstrom
- 16, gate spacers, typically comprising silicon nitride, formed over sidewalls of the gate structure 12.

It is assumed in the cross section that is shown in FIG. 1 that LDD and source/drain impurity implantations into the surface of substrate 10 (not shown) have been completed immediately after the formation of the gate structure 12 that is shown in cross section in FIG. 1 and prior to the formation of gate spacers 16.

The layer 14 of oxide liner can be formed by thermally growing of a thin oxide over the sides of the gate electrode 12 and over the surface of the substrate 10, using a short dryoxidation process whereupon a conformal CVD oxide film is deposited by decomposing TEOS at between 700 and 750 degrees C.

Gate spacers for gate electrodes are typically created using a variety of materials such as silicon oxide, silicon nitride, BSG, PSG, other materials preferably of a dielectric nature, CVD oxide formed from a TEOS source. The preferred material of the invention for the creation of the gate spacers 16 is silicon nitride.

Gate spacers 16 are formed by first depositing a layer 16 of silicon nitride ($Si_3N_4$) over the surface of the liner oxide 14. The layer 16 of silicon nitride can conventionally be deposited using LPCVD or PECVD procedures at a pressure between about 300 mTorr and 400 mTorr, at a temperature between about 600 and 800 degrees C., to a thickness of between about 2,000 and 3,000 Angstrom using $NH_3$ and $SiH_4$. The silicon nitride layer 16 can also be deposited using LPCVD or PECVD procedures using a reactant gas mixture such as dichlorosilane ($SiCl_2H_2$) and ammonia ($NH_3$). The preferred thickness of the invention for the layer of gate spacer material is between about 600 and 1200 Angstrom.

After deposition of a layer 16 of for instance silicon nitride of gate spacer material, the layer 16 of silicon nitride is etched, stopping on the layer 14 of oxide liner. Shown in FIG. 1 are spacers 16 of silicon nitride created on the sidewalls of the gate electrodes 12. The preferred method of the invention for the etch of the layer 16 of silicon nitride is a dry etch such as applying an RIE etch using $CHF_3$ or $SF_6$—$O_2$ as an etchant.

It must be noted in the cross section that is shown in FIG. 1 that the layer 14 of TEOS, after spacer etch, remains in place overlying the surface of the substrate 10 and overlying the surface of the structure 12 of the gate electrode due to the good etch selectivity between the silicon nitride that is used for the gate spacers 16 and the deposited layer 14 of TEOS. The original thickness of the layer 14 of liner oxide of between about 150 and 250 Angstrom is, after the etch for the creation of gate spacers 16, reduced to a thickness between about 130 and 230 Angstrom.

Figure 2:
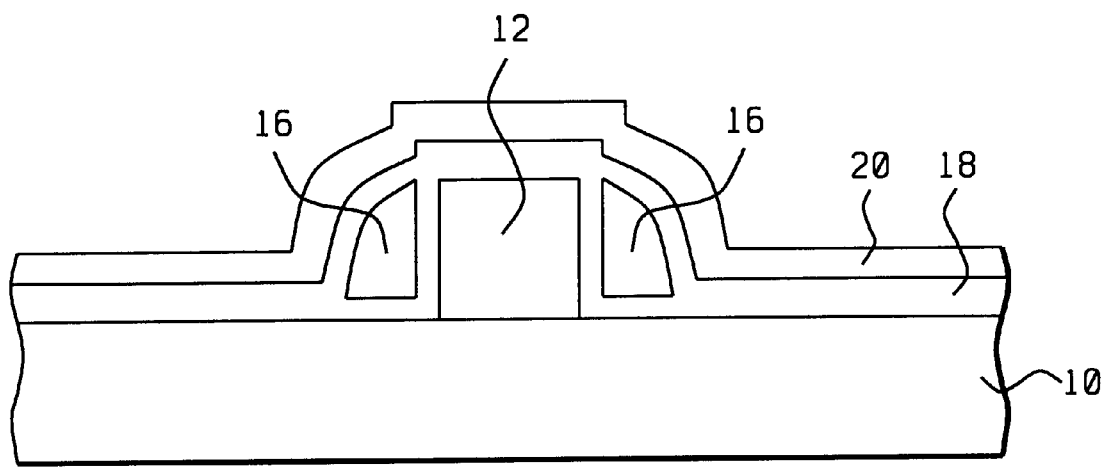
FIGS. 2 through 5 address a first embodiment of the invention, as follows.

The nitride salicide block approach continues, see FIG. 2, with the deposition of a layer 18 of TEOS of between about 100 and 200 Angstrom thick, deposited by applying CVD or PE-CVD technology LPCVD procedures at a temperature of between about 600 and 700 degrees C. and deposited over the exposed surfaces of the structure that is shown in cross section in FIG. 1. The layer of TEOS that is shown in the cross section of FIG. 2 as layer 18, is a fusion of layer 14 of TEOS of FIG. 1 with the newly deposited layer of TEOS where the newly deposited layer of TEOS is in contact with layer 14 (which is not the case for the newly deposited layer of TEOS overlying the gate spacers 16).

It will be noted in the cross section of FIG. 2 that the height of layer 18 overlying the surface of substrate 10 and the surface of the gate material 12 is larger than the height of layer 14 in FIG. 1 by a measurable amount, due to the deposition of the additional layer of TEOS over the surface of layer 14. The interface between the layer 14 of FIG. 1 and the newly deposited layer of TEOS overlying layer 14 is not highlighted in the cross section of FIG. 2 since both layers combine to form one layer of TEOS. The indicated difference in thickness between layer 14 of FIG. 1 and layer 18 of FIG. 2 (where layer 18 overlies the surface of substrate 10 and the surface of the gate material 12) reflects the deposition of the additional layer of TEOS.

Assuming good step coverage of the created layer 18 of TEOS, the layer 18 of TEOS overlying the gate spacers 16 is between about 100 and 200 Angstrom thick while the layer 18 of TEOS overlying the active surface areas of the substrate surrounding the gate structure 12 and the layer of TEOS on the surface of the gate structure 12 is between about 200 and 400 Angstrom thick.

The latter is due to the previously stated observation that the layer of TEOS remains in place, with reduced thickness, overlying the surface of the substrate 10 and overlying the surface of the structure 12 of the gate electrode after the gate spacer (16, FIG. 1) etch. The thickness of the original layer 14 of TEOS is, due to the gate spacer etch, reduced from an original value of between about 150 and 250 Angstrom to between about 130–230 Angstrom.

After the layer 18 of TEOS has been created, a layer 20 of silicon nitride is deposited over the surface of layer 18 of TEOS to a thickness between about 200 and 400 Angstrom. The layer 20 of silicon nitride (Si3N4) can be deposited using LPCVD or PECVD procedures at a pressure between about 300 mTorr and 400 mTorr, at a temperature between about 600 and 800 degrees C., preferably deposited to a thickness of between about 200 and 400 Angstrom using $NH_3$ and $SiH_4$. The silicon nitride layer 20 can also be deposited using LPCVD or PECVD procedures using a reactant gas mixture such as dichlorosilane ($SiCl_2H_2$) and ammonia ($NH_3$)

Figure 3:
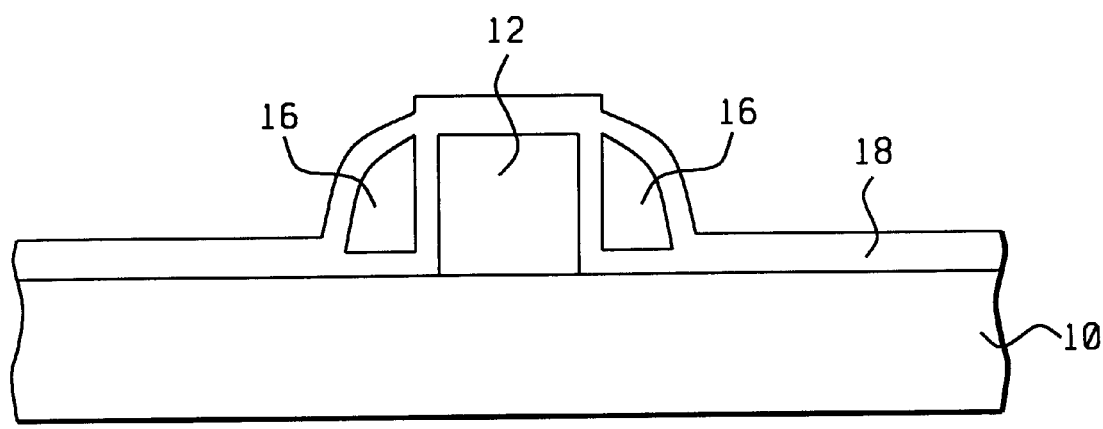
Figure 4:
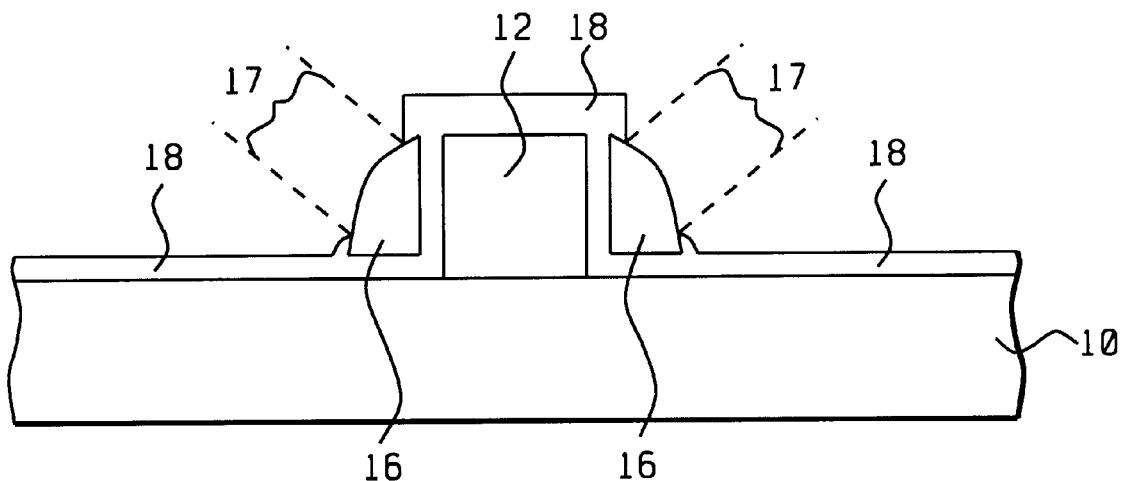

For the cross section that is shown in FIG. 2 and as a continuation of the nitride salicide block process, the nitride salicide block etch, a main nitride etch of layer 20 is first performed. This nitride etch will essentially:

remove the nitride layer 20 from above the surface of the layer 18 of TEOS as shown in cross section in FIG. 3, and substantially etch through the layer 18 of TEOS where this layer overlies the silicon gate spacers 16 as shown in cross section in FIG. 4, creating the opening 17, FIG. 4, through the layer 18 of TEOS.

The main nitride etch will not etch through to the active surface area of the substrate 10 or through to the layer 12 of gate material since these surfaces are covered with a relatively thick layer of TEOS.

The preferred method of the invention for the main silicon nitride etch of the layer 20 is a dry etch such as applying an RIE etch using CHF3 or $SF_6$—$O_2$ as an etchant.

Figure 5:
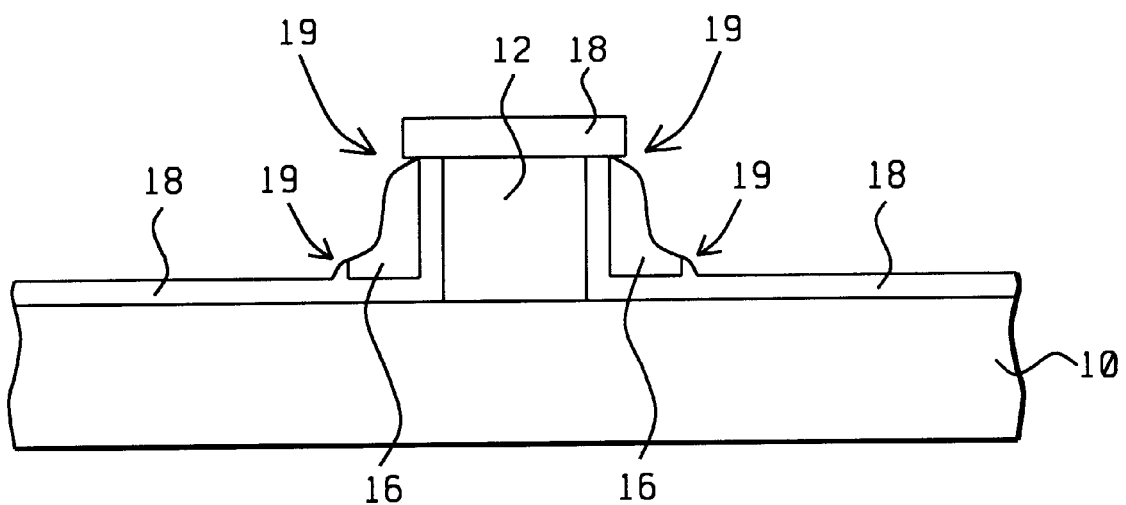

The main nitride etch can (from the cross section shown in FIG. 4) be continued, FIG. 5, such that the (nitride) gate spacers 16 are further etched in accordance with the opening 17 that has been created through the layer 18 of TEOS where this layer overlies the gate spacers 16. It is well known in the art that the etch rate for nitride is considerably faster that the etch rate of TEOS. A protective layer of TEOS, consisting among others of oxide stringers in locations 19, FIG. 5, that have been formed during and after TEOS punchthrough (and surrounding the opening 17 that has been created through the layer 18 of TEOS) will therefore essentially remain in place. The exposed surface of the nitride gate spacers 16 will be etched at a relatively fast rate. This allows for the creation of an essentially L-shaped profile of the remaining layer 16 of silicon nitride as shown in cross section in FIG. 5.

This L-shaped profile of the gate spacers 16 will be created while the layer 18 of TEOS overlying the active surface area of the substrate 10 surrounding the gate structure 12 and the TEOS overlying the gate structure 12 remains largely in place.

Also, since source/drain implantations have been completed immediately after the formation of the gate structure that is shown in cross section in FIG. 1, the profile of the L-shaped gate structure is of no concern for impurity implantations at this time. In addition, the oxide stringers in locations, 19, FIG. 5, that have been formed after TEOS punchthrough, will protect the spacer shoulders and the spacer width during the etch of the spacers 16 to create the L-shaped spacers 16. These oxide stringers will be removed from locations 19 at the time of pre-salicidation, pre-cobalt clean.

This completes the description of the nitride salicide block process of the invention. Next will be described the TEOS salicide block process of the invention using cross section of FIGS. 6 through 8.

Figure 6:
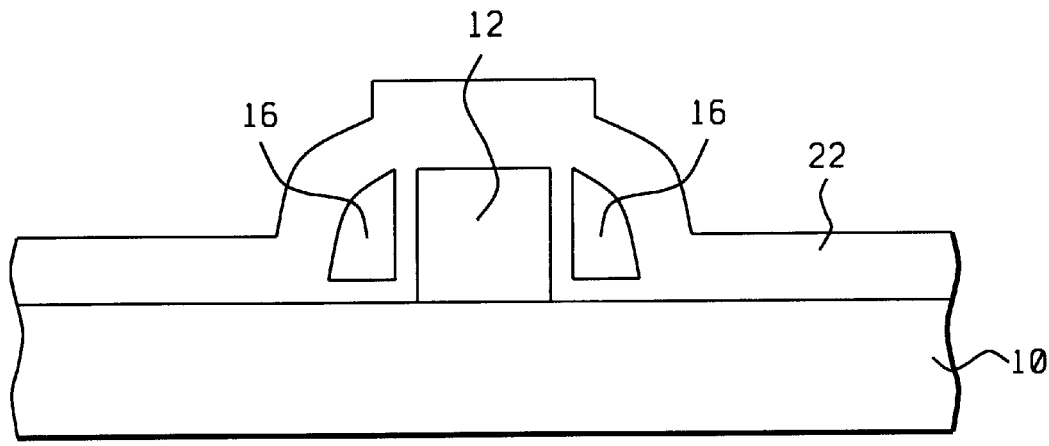
FIGS. 6 through 8 address a second embodiment of the invention, as follows.

The cross section of FIG. 6 shows how a relatively thick layer 22 of TEOS has been created, using above highlighted methods and processing conditions, by the deposition of an additional layer of TEOS over the structure that is shown in cross section in FIG. 1. The layer 22 of TEOS is deposited to a thickness between about 300 and 500 Angstrom, creating the highlighted layer 22 of FIG. 6.

The layer 22 of TEOS is thicker where layer 22 overlies the active surface regions of substrate 10 (surrounding the gate electrode) and the gate electrode 12 than the layer 22 of TEOS overlying the gate spacers 16 of the gate electrode that is shown in cross section in FIG. 6. This is due to the presence of layer 14, FIG. 1, of TEOS prior to the deposition of the (additional) layer of TEOS. The layer 22 of TEOS, FIG. 6, will be etched (the main TEOS etch), which will stop with high selectivity on the silicon of gate spacers 16, see the cross section of FIG. 7. TEOS oxide stringers will also be formed in locations 21, FIG. 7, on the shoulders and the foot of the gate spacers 16. Nitride chemical wet etch is known to have high selectivity with respect to polysilicon (layer 12, FIG. 7) and TEOS oxide (layer 22, FIG. 7). Applying therefore wet chemical nitride etch after the main TEOS etch has been completed (FIG. 7) allows the formation of almost L-shaped gate spacers with minimal gouging into the substrate and the surface of surrounding regions of field oxide as shown in cross section in FIG. 8. The oxide stringers 21, FIG. 7, will be removed at the time of pre-salicidation, pre-cobalt clean.

The preferred etching conditions of the invention for the main etch of TEOS layer 22 are applying an etchant gas of $CF_4$ or CHF3 at a flow rate of about 15 sccm, at a gas pressure about 800 mTorr, a rf power density of about 400 Watts, no magnetic field applied, an ambient wafer temperature, time of the etch being time controlled and experimentally determined.

The first embodiment of the invention can be summarized as follows:

a substrate is provided at least one gate electrode is created over the surface of the substrate impurity implantations are performed into the surface of the substrate self-aligned with the created at least one gate electrode a layer of liner oxide, comprising TEOS, is formed to a thickness between about 150 and 250 Angstrom over the exposed surface of the substrate and exposed surfaces of the at least one gate electrode gate spacers, comprising silicon nitride, are formed over sidewalls of the at least one gate electrode, the gate spacer etch stops on the layer of liner oxide, reducing the original thickness of the layer of liner oxide to between about 100 and 200 Angstrom a layer of TEO is deposited over the gate spacers and exposed surface of the layer of liner oxide fusing with the original layer of TEOS of reduced thickness where the layer of liner oxide and the deposited layer of TEOS intersect a layer of nitride is deposited over the surface of the deposited layer of TEOS, and a main etch is applied to the deposited layer of nitride, comprising:
1. an overetch through the layer of TEOS deposited over the gate spacers
2. creating an opening through the layer of TEOS where the layer of TEOS overlies the gate spacers
3. exposing tie gate spacers of silicon nitride, and
4. forming oxide stringers over spacer shoulders and the foot of the spacers, and further etching into the exposed surface of the gate spacers, applying a nitride etch.

The second embodiment of the invention can be summarized as follows:
- a substrate is provided
- at least one gate electrode is created over the surface of the substrate
- impurity implantations are performed into the surface of the substrate self-aligned with the created at least one gate electrode
- a layer of liner oxide, comprising TEOS, is formed to a thickness between about 150 and 250 Angstrom over the exposed surface of the substrate and exposed surfaces of the at least one gate electrode
- gate spacers, comprising silicon nitride, are formed over sidewalls of the at least one gate electrode, the gate spacer etch stops on the layer of liner oxide, reducing the original thickness of the layer of liner oxide to between about 130 and 230 Angstrom
- a layer of TEOS is deposited over the gate spacers and exposed surface of the layer of liner oxide fusing with the original layer of TEOS of reduced thickness where the layer of liner oxide and the deposited layer of TEOS intersect
- the layer of TEOS is etched, comprising:
  1. stopping with high selectivity on the gate spacers (of silicon nitride)
  2. creating an opening through the layer of TEOS where the layer of TEOS overlies the gate spacers
  3. exposing the gate spacers of silicon nitride
  4. forming the oxide stringers over spacer shoulders and the foot of the spacers, and
- further etching into the exposed surface of the gate spacers, applying a nitride etch.

The first embodiment of the invention, which provides a method for the creation of gate spacers over sidewalls of a patterned and etched layer of gate material, can more specifically be summarized as follows:
- providing a semiconductor substrate, the substrate having been provided with active surface regions in the surface thereof
- creating at least one patterned and etched layer of gate electrode material over the active surface regions of the substrate
- providing impurity implantations into the active surface regions of the substrate self-aligned with the at least one patterned and etched layer of gate electrode material
- creating a layer of liner oxide over exposed surfaces of the at least one patterned and etched layer of gate electrode material, thereby including the surface of the active surface region provided in the surface of the substrate
- creating gate spacers using a first layer of gate spacer material, such as silicon nitride, over sidewalls of the at least one patterned and etched layer of gate electrode material
- depositing a layer of high-temperature imageable material, such as TECS, over the exposed surface of the gate spacers, thereby including exposed surfaces of the layer of liner oxide, the layer of high-temperature imageable material being selected as having an etch rate that is lower than an etch rate of the layer of first gate spacer material by a measurable amount, the layer of high-temperature imageable material further being selected as being able to combine with the layer of liner oxide forming a combined layer having uniform semiconductor processing characteristics of the combined layer
- depositing a second layer of the gate spacer material, such as silicon nitride, over the surface of the layer of high-temperature imageable material, the second layer of the gate spacer material being selected as having an etch rate about equal to an etch rate of the first layer of gate spacer material
- etching the second layer of gate spacer material, the etching comprising:
  (i) stopping on about the surface of the layer of high-temperature imageable material, thereby reducing an original thickness of the layer of high-temperature imageable material by a measurable amount; then
  (ii) over-etching through the layer of high-temperature imageable material deposited over the exposed surface of the gate spacers, creating an opening through the layer of high-temperature imageable material where the layer of high-temperature imageable material overlies the gate spacers, exposing the surface of the gate spacers, and
  iii) forming stringers of high-temperature imageable material adjacent to the opening created through the layer of high-temperature imageable material and overlying the gate spacers, and
- etching the exposed surface of the gate spacers.

It must Thereby be understood that he above cited reducing an original thickness of the layer of high-temperature imageable material by a measurable amount comprises reducing a thickness of the layer of high-temperature imageable material from between about 100 and 200 Angstrom to between about 75 and 150 Angstrom.

The second embodiment of the invention, which provides a method for the creation of gate spacers over sidewalls of a patterned and etched layer of gate material, can more specifically be summarized as follows:
- providing a semiconductor substrate, the substrate having been provided with active surface regions in the surface thereof
- creating at least one patterned and etched layer of gate electrode material over-the active surface regions of the substrate
- providing impurity implantations into the active surface regions of the substrate self-aligned with the at least one patterned and etched layer of gate electrode material
- creating a layer of liner oxide over exposed surfaces of the at least one patterned and etched layer of gate electrode material, thereby including the surface of the active surface region provided in the surface of the substrate
- creating gate spacers using a layer of gate spacer material, such as silicon nitride, over sidewalls of the at least one patterned and etched layer of gate electrode material
- depositing a layer of high-temperature imageable material, such as TEOS, over the exposed surface of the gate spacers, thereby including exposed surfaces of the layer of liner oxide, the layer of high-temperature imageable material being selected as having an etch rate that is lower than an etch rate of the layer of first gate spacer material by a measurable amount, the layer of high-temperature imageable material further being selected as being able to combine with the layer of liner oxide forming a combined layer having uniform semiconductor processing characteristics of the combined layer
- a etching the layer of high-temperature imageable material, the etching comprising:
  (i) stopping on about the surface of the flyer of gate spacer material, creating an opening through the layer of high-temperature imageable material where the layer of high-temperature imageable material overlies the gate spacers, exposing the surface of the gate spacers; and (ii) forming stringers of high-temperature imageable material, such as TEOS, adjacent to the opening created through the layer of high-temperature imageable material and overlying the gate spacers, and etching the exposed surface of the gate spacers.

What is claimed is:

1. A method for the creation of gate spacers over sidewalls of a patterned and etched layer of gate material, comprising the steps of:

(A) providing a semiconductor substrate, said substrate having been provided with active surface regions in the surface thereof;

(B) creating at least one patterned and etched layer of gate electrode material over the active surface regions of said substrate;

(C) providing impurity implantations into the active surface regions of said substrate self-aligned with said at least one patterned and etched layer of gate electrode material.;

(D) creating a layer of liner oxide over exposed surfaces of said at least one patterned and etched layer of gate electrode material, thereby including the surface of said active surface regions provided in the surface of said substrate;

(E) creating gate spacers using a first layer of gate spacer material over sidewalls of said at least one patterned and etched layer of gate electrode material;

(F) depositing a layer of high-temperature imageable material over the exposed surface of said gate spacers, thereby including exposed surfaces of said layer of liner oxide, said layer of high-temperature imageable material being selected as having an etch raze that is lower than an etch rate of said first layer of gate spacer material by a measurable amount, said layer of high-temperature imageable material further being selected as being able to combine with said layer of liner oxide forming a combined layer having uniform semiconductor processing characteristics of said combined layer;

(G) depositing a second layer of said gate spacer material over the surface of said layer of high-temperature imageable material, said second layer of said gate spacer material being selected as having an etch rate about equal to an etch rate of said first layer of gate spacer material;

(H) etching said second layer of gate spacer material, said etching comprising:

(i) stopping on about the surface of said layer of high-temperature imageable material, thereby reducing an original thickness of said layer of high-temperature imageable material by a measurable amount; then (ii) over-etching through the layer of high-temperature imageable material deposited over the exposed surface of said gate spacers, creating an opening through the layer of high-temperature imageable material where the layer of high-temperature imageable material overlies the gate spacers, exposing the surface of said gate spacers, and (iii) forming stringers of high-temperature imageable material adjacent to said opening created through the layer of high-temperature imageable material and overlying the gate spacers; and (I) etching the exposed surface of said gaze spacers.

2. The method of claim 1, said layer of gate electrode material comprising polysilicon.

3. The method of claim 1, said layer of gate electrode material being deposited to a thickness of between about 3,000 and 7,000 Angstrom.

4. The method of claim 1, said providing impurity implantations into the active surface regions of said substrate comprising implantations of Lightly Doped Diffusion (LDD) regions and source and drain regions.

5. The method of claim 1, said layer of liner oxide comprising tetra-ethyl-ortho-silicate (TEOS).

6. The method of claim 1, said layer of liner oxide being created to a thickness between about 150 and 250 Angstrom.

7. The method of claim 1, said first layer of gate spacer material comprising silicon nitride.

8. The method of claim 1, said first layer of gate spacer material being deposited to a thickness of between about 600 and 1,200 Angstrom.

9. The method of claim 1, said layer of high-temperature imageable material comprising tetra-ethyl-ortho-silicate (TEOS).

10. The method of claim 1, said layer of high-temperature imageable material being deposited to a thickness between about 100 and 200 Angstrom.

11. The method of claim 1, said second layer of said gate spacer material comprising silicon nitride.

12. The method of claim 1, said second layer of said gate spacer material being deposited to a thickness between about 200 and 400 Angstrom.

13. The method of claim 1, additionally removing said stringers of high-temperature imageable material from adjacent to said opening created through the layer of high-temperature imageable material and overlying the gate spacers in preparation for a salicidation process.

14. The method of claim 1, said reducing the original thickness of said layer of high-temperature imageable material by the measurable amount comprising reducing a thickness of said layer of high-temperature imageable material from between about 150 and 250 Angstrom to between about 130 and 230 Angstrom.

15. A method for the creation of gate spacers over sidewalls of a patterned and etched layer of gate material, comprising the steps of:

providing a semiconductor substrate, said substrate having been provided with active surface regions in the surface thereof;

creating at least one .patterned and etched layer of gate electrode material over the active surface regions of said substrate;

providing impurity implantations into the active surface regions of said substrate self-aligned with sand at least one patterned and etched layer of gate electrode material;

creating a layer of liner oxide over exposed surfaces of said at least one patterned and etched layer of gate electrode material, thereby including the surface of said active surface regions provided in the surface of said substrate;

creating gate spacers of silicon nitride offer sidewalls of said at least one patterned and etched layer of gate electrode material;

depositing a layer of TEOS over the exposed surface of said gate spacers, thereby including exposed surfaces of said layer of liner oxide;

depositing a layer of silicon nitride over the surface of said layer of TEOS;

etching said layer of silicon nitride, stopping on about the surface of said layer of TECS, thereby reducing an original thickness of said layer of TEOS by a ,measurable amount; then over-etching through the layer of TEOS deposited over the exposed surface of said gate spacers, creating an opening through the layer of TEOS where the layer of TEOS overlies the gate spacers, exposing the surface of said gate spacers, forming stringers of TEOS adjacent to said opening created through the layer of TEOS and overlying the gate spacers; and etching the exposed surface of said gate spacers.

16. The method of claim 15, said layer of gate electrode material comprising polysilicon.

17. The method of claim 15, said layer of gate electrode material being deposited to a thickness of between about 3,000 and 7,000 Angstrom.

18. The method of claim 15, said providing impurity implantations into the active surface regions of said substrate comprising implantations of Lightly Doped Diffusion (LDD) regions and source and drain region.

19. The method of claim 15, said layer of liner oxide comprising tetra-ethyl-ortho-silicate (TEOS).

20. The method of claim 15, said layer of liner oxide being created to a thickness between about 150 and 250 Angstrom.

21. The method of claim 15, silicon nitride for said gate spacers being deposited to a thickness of between about 600 and 1,200 Angstrom.

22. The method of claim 15, said layer of TEOS being deposited to a thickness between about 100 and 200 Angstrom.

23. The method of claim 15, said layer of silicon nitride being deposited to a thickness between about 200 and 400 Angstrom.

24. The method of claim 15, additionally removing said stringers of TEOS from adjacent to said opening created through the layer of TEOS and overlying the gate spacers in preparation for a salicidation process.

25. The method of claim 15, said reducing the original thickness of said layer of TEOS by the measurable amount comprising reducing a thickness of said TEOS from between about 100 and 200 Angstrom to between about 75 and 150 Angstrom.

26. A method for the creation of gate spacers over sidewalls of a patterned and etched layer of gate material, comprising the steps of:

(A) providing a semiconductor substrate, said substrate having been provided with active surface regions in the surface thereof;

(B) creating at least one patterned and etched layer of gate electrode material over the active surface regions of said substrate;

(C) providing impurity implantations into the active surface regions of said substrate self-aligned with said at least one patterned and etched layer of gate electrode material;

(D) creating a layer of liner oxide over exposed surfaces of said at least one patterned and etched layer of gate electrode material, thereby including the surface of said active surface regions provided in the surface of said substrate;

(E) creating gate spacers using a layer of gate spacer material over sidewalls of said at least one patterned and etched layer of gate electrode material;

(F) depositing a layer of high-temperature imageable material over the exposed surface of said gate spacers, thereby including exposed surfaces of said layer of liner oxide, said layer of high-temperature imageable material being selected as having an etch rate that is lower than an etch rate of said layer of gate spacer material by a measurable amount, said layer of high-temperature imageable material further being selected as being able to combine with said layer of liner oxide forming a combined layer having uniform semiconductor processing characteristics of said combined layer;

(G) etching said layer of high-temperature imageable material, said etching comprising:

(i) stopping on about the surface of said layer of gate spacer material, creating an opening through the layer of high-temperature imageable material where the layer of high-temperature imageable material overlies the gate spacers, exposing the surface of said gate spacers; and (ii) forming stringers of high-temperature imageable material adjacent to said opening created through the layer of high-temperature imageable material and overlying the gate spacers; and (H) etching the exposed surface of said gate spacers.

27. The method of claim 26, said layer of gate electrode material comprising polysilicon.

28. The method of claim 26, said layer of gate electrode material being deposited to a thickness of between about 3,000 and 7,000 Angstrom.

29. The method of claim 26, said providing impurity implantations into the active surface regions of said substrate comprising implantations of Lightly Doped Diffusion (LDD) regions and source and drain regions.

30. The method of claim 26, said layer of liner oxide comprising tetra-ethyl-ortho-silicate (TEOS).

31. The method of claim 26, said layer of liner oxide being created to a thickness between about 150 and 250 Angstrom.

32. The method of claim 26, said layer of gate spacer material comprising silicon nitride.

33. The method of claim 26, said layer of gate space material being deposited to a thickness of between about 600 and 1,200 Angstrom.

34. The method of claim 26, said layer of high-temperature imageable material comprising tetra-ethyl-ortho-silicate (TEOS).

35. The method of claim 26, said layer of high-temperature imageable material being deposited to a thickness between about 300 and 500 Angstrom.

36. The method of claim 26, additionally removing said stringers of high-temperature imageable material from adjacent to said opening created through the layer of high-temperature imageable material and overlying the gate spacers in preparation for a salicidation process.

37. A method for the creation of gate spacers over sidewalls of a patterned and etched layer of gate material, comprising the steps or:

providing a semiconductor substrate, said substrate having been provided with active surface regions in the surface thereof;

creating at least one patterned and etched layer of gate electrode material over the active surface regions of said substrate;

providing impurity implantations into the active surface regions of said substrate self-aligned with said at least one patterned and etched layer of gate electrode material;

creating a layer of liner oxide over exposed surfaces of said at least ore patterned and etched layer of gate electrode material, thereby including the surface of said active surface regions provided in the surface of said substrate;

creating gate spacers of silicon nitride over sidewalls of said at least one patterned and etched layer of gate electrode material;

depositing a layer of TEOS over exposed surface of said gate spacers, thereby including exposed surfaces of said layer of liner oxide;

etching said layer of TEOS, stopping on about the surface of said gate spacers, creating an opening through the layer of TEOS where the layer of TEOS overlies the gate spacers, exposing the surface of said gate spacers, forming stringers of TEOS adjacent to said opening created through the layer of TEOS and overlying the gate spacers; and etching the exposed surface of said gate spacers.

38. The method of claim 37, said layer of gate electrode material comprising polysilicon.

39. The method of claim 37, said layer of gate electrode material being deposited to a thickness of between about 3,000 and 7,000 Angstrom.

40. The method of claim 37, said providing impurity implantations into the active surface regions of said substrate comprising implantations of Lightly Doped Diffusion (LDD) regions and source and drain regions.

41. The method of claim 37, said layer of liner oxide comprising tetra-ethyl-ortho-silicate (TEOS).

42. The method of claim 37, said layer of liner oxide being created to a thickness between about 150 and 250 Angstrom.

43. The method of claim 37, silicon nitride for said gate spacers being deposited to a thickness of between about 600 and 1,200 Angstrom.

44. The method of claim 37, said layer of TEOS being deposited to a thickness between about 300 and 500 Angstrom.

45. The method of claim 37, additionally removing said stringers of TEOS from adjacent to said opening created through the layer of high-temperature imageable material and overlying the gate spacers in preparation for a salicidation process.

* * * * *

UNITED STATES PATENT AND TRADEMARK OFFICE
CERTIFICATE OF CORRECTION

PATENT NO.      : 6,632,745 B1                                                        Page 1 of 1
DATED           : October 14, 2003
INVENTOR(S)     : Chiew Wah Yap et al.

It is certified that error appears in the above-identified patent and that said Letters Patent is hereby corrected as shown below:

<u>Title page,</u>
Item [75], Inventors, delete "Chiew Wah Yap, S'pore (SG)", and replace with
-- Chiew Wah Yap, Singapore (SG) --, delete "Nguyen Lac, Singapore (SG)", and replace with -- Nguyen Van Lac, Singapore (SG) --, and delete "Yelehanka Pradeep, Singapore (SG)", and replace with -- Yelehanka Ramachandramurthy Pradeep, Singapore (SG) --.

Signed and Sealed this

Tenth Day of February, 2004

JON W. DUDAS
*Acting Director of the United States Patent and Trademark Office*